United States Patent
Pfitzner et al.

(10) Patent No.: US 8,584,611 B2
(45) Date of Patent: Nov. 19, 2013

(54) IN-LINE VACUUM COATING SYSTEM

(75) Inventors: Manfred Pfitzner, Dresden (DE);
Guenther Sickert, Dresden (DE);
Roberto Kaiser, Dresden (DE);
Andreas Vogt, Dresden (DE)

(73) Assignee: FHR Anlagenbau GmbH,
Ottendorf-Okrilla (DE)

( * ) Notice: Subject to any disclaimer, the term of this patent is extended or adjusted under 35 U.S.C. 154(b) by 127 days.

(21) Appl. No.: 13/141,176

(22) PCT Filed: Dec. 18, 2009

(86) PCT No.: PCT/EP2009/067557
§ 371 (c)(1),
(2), (4) Date: Aug. 1, 2011

(87) PCT Pub. No.: WO2010/072686
PCT Pub. Date: Jul. 1, 2010

(65) Prior Publication Data
US 2011/0297077 A1    Dec. 8, 2011

(30) Foreign Application Priority Data
Dec. 22, 2008   (DE) .......................... 10 2008 064 183

(51) Int. Cl.
*C23C 14/00*    (2006.01)
*C23C 16/00*    (2006.01)

(52) U.S. Cl.
USPC .............. 118/50; 118/718; 118/307; 118/500

(58) Field of Classification Search
USPC ........... 118/50, 306, 307, 317, 718, 719, 500; 427/230, 236, 237, 238; 74/422; 198/465.3; 414/173
See application file for complete search history.

(56) References Cited

U.S. PATENT DOCUMENTS

| | | | |
|---|---|---|---|
| 4,197,336 A * | 4/1980 | Savchenko et al. | ........... 427/234 |
| 6,027,618 A | 2/2000 | Aruga et al. | |
| 2007/0034508 A1 | 2/2007 | Sheu et al. | |
| 2008/0276451 A1 | 11/2008 | Morad | |

FOREIGN PATENT DOCUMENTS

DE    102007048758 A1    4/2008

OTHER PUBLICATIONS

International Search Report for PCT/EP2009/067557 dated Mar. 30, 2010.

* cited by examiner

*Primary Examiner* — Yewebdar Tadesse
(74) *Attorney, Agent, or Firm* — Heslin Rothenberg Farley & Mesiti P.C.

(57) ABSTRACT

An in-line vacuum coating system includes a vacuum chamber, a coating source and a substrate carrier for holding tubular substrates, the carrier being displaceable using the vacuum chamber. A sure method of simply and securely coupling a fixed rotational drive unit to a carrier that can be displaced at a constant rate of speed in an in-line vacuum coating system is accomplished by a fixed splined shaft rotatably installed and connectable to a rotational drive unit, and a gearwheel that can be engaged with the splined shaft and that is rotatably mounted on the carrier. The gearwheel is longitudinally displaceable to a predefined extent in spring-loaded fashion in a direction opposite to the direction of travel of the carrier.

10 Claims, 3 Drawing Sheets

IN-LINE VACUUM COATING SYSTEM

CROSS REFERENCE TO RELATED APPLICATIONS

This application is a national stage filing under section 371 of International Application No. PCT/EP2009/067557 filed on Dec. 18, 2009, and published in German on Jul. 1, 2010 as WO 2010/072686 and claims priority of German application No. 10 2008 064 183.9 filed on Dec. 22, 2008, the entire disclosure of these applications being hereby incorporated herein by reference.

BACKGROUND ART

The invention relates to an in-line vacuum coating system having a vacuum chamber, at least one coating unit and a carrier, that can be moved through the vacuum chamber, for holding tubular substrates.

When a carrier is used in in-line continuous systems, the substrates are usually statically fixed in order then to be coated as they pass a coating source. A carrier should be understood in the following to mean a substrate support in which the tubular substrates can be positioned in a spaced-apart manner one above another and can be rotated about their longitudinal axes.

In the case of two-dimensional substrates this is readily possible, whereas in the case of rotationally symmetrical substrates, such as pipes, which are also much longer than customary coating sources, the substrate axes are rotated in the horizontal plane through 90° with respect to the coating source.

In order also in this case to ensure uniform coating while passing a coating source, such substrates are arranged on a carrier. As a rule, a plurality of substrates are arranged at the same time on a carrier.

In order to obtain high coating homogeneity on the lateral surface of the substrate, the substrates not only to have be moved in the direction of the longitudinal axis relative to the source, but also have to be rotated about their longitudinal axis. For this purpose, it is necessary to have two drives, which have to be adjustable independently of one another in order that the feed rate of the carrier and the rotational speed of the substrates can be set appropriately. In this way, the necessary coating homogeneity of the helically applied coating can be achieved, wherein the coating should extend without interruption over the entire surface of the substrates.

BRIEF SUMMARY OF INVENTION

The invention is based on the object of creating an in-line vacuum coating system having a vacuum coating chamber, at least one coating unit and a carrier that can be moved through the vacuum chamber, in which a fixed rotary drive can be coupled easily, securely and with a low degree of wear to the carrier that can be moved at a constant speed.

This is achieved by a rotatable toothed shaft which is installed in a fixed position and is connected to a rotary drive, and by a gearwheel which can be brought into engagement with the toothed shaft, is mounted in a rotatable manner on the carrier and can be moved longitudinally under spring loading by a predefined distance counter to the direction of travel of the carrier.

The gearwheel has straight teeth.

The spring loading of the gearwheel is achieved in that the gearwheel is positioned in a starting position under spring loading between two compression springs.

Alternatively, in the case of only one direction of travel, the gearwheel is positioned under spring loading in a starting position against a stop which, as seen in the direction of travel is located downstream of the starting position.

In both cases, even in the event of a slight deflection of the gearwheel out of the starting position, said gearwheel engages with the toothing on the toothed shaft.

In a continuation of the invention, the gearwheel is guided on a shaft that is secured to the carrier.

Furthermore, the gearwheel can be moved longitudinally in a positively locking manner on the shaft, which can be rotated in the carrier, as a result of which a rotational movement of the gearwheel can be transferred to the shaft.

Finally, secured to one end of the shaft is a pulley for holding a transmission belt, which runs on the drive-input side on the pulley and on the drive-output side on a further pulley which is coupled to further rollers.

The further pulley is coupled to the further rollers by way of frictional coupling or else by means of gearwheels.

In a further refinement of the invention the further pulley and the further rollers are mounted in a rotatable manner in a frame of the carrier.

In order to be able to grip tubular substrates in a rotatable manner, the further rollers are each provided in the axial direction with a conical holder for fixing the end side of the tubular substrate, wherein the respectively other end side of the tubular substrate is mounted in a corresponding manner. It goes without saying that in order to securely hold the tubular substrates the two conical holders that are thus located opposite one another are pushed against one another, for example under spring loading, once the substrates have been positioned between the conical holders.

Furthermore, the toothed shaft, as main drive, is mounted in a fixed position in the vacuum chamber, specifically in such a way in relation to the gearwheel located on the carrier that in the engagement position said gearwheel meshes with the toothed shaft over the longitudinal extent thereof.

The expression "tubular substrate" stands not only for example for pipes but is intended also to apply to all longitudinally extended substrates, such as profile tubes and profile bars or the like, which are intended to be coated all over in the in-line vacuum system.

BRIEF DESCRIPTION OF DRAWING FIGURES

The invention is explained in more detail in the following text by way of an exemplary embodiment. In the associated drawings.

DETAILED DESCRIPTION

Figure 1:
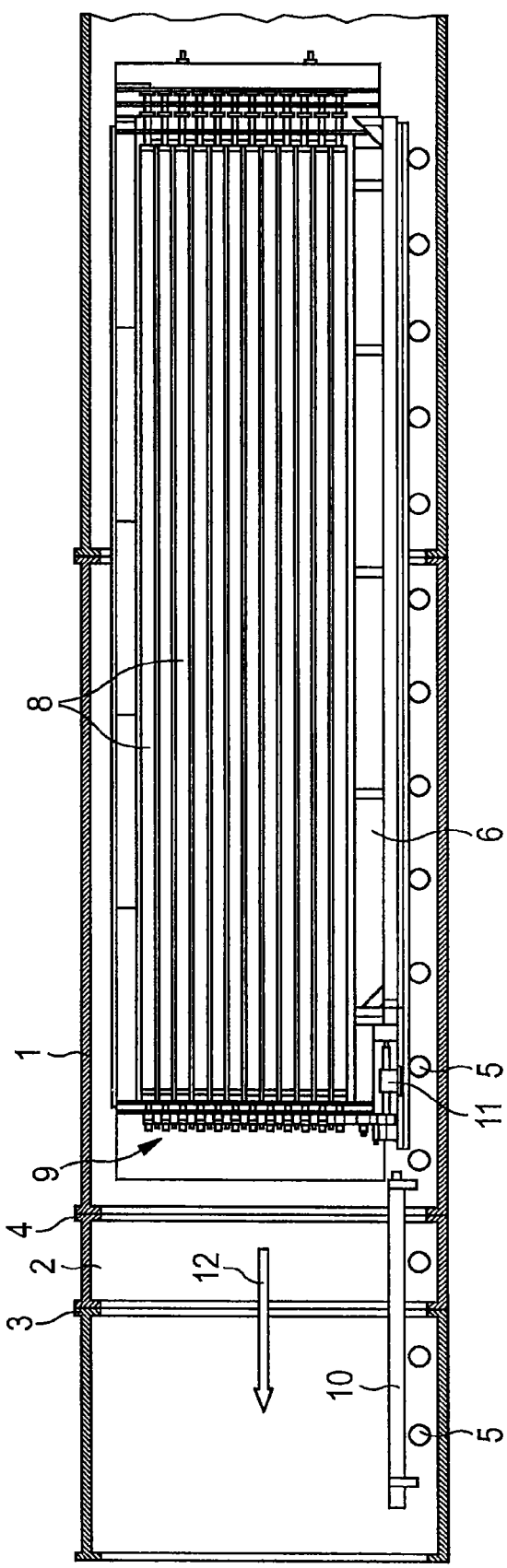
FIG. 1 shows a schematic overview of an in-line vacuum coating system having a carrier which is fitted with tubular substrates.

According to the overview in FIG. 1, the in-line vacuum coating system 1 contains a vacuum chamber 2 having vacuum locks 3, 4 on the input and output sides and a guiding and transporting device, which is schematically illustrated by rollers 5, for transporting a carrier 6 longitudinally through the in-line vacuum coating chamber 1.

The carrier 6 includes a support frame 7, in which a plurality of tubular substrates 8 are held one above another such that they can be rotated about their longitudinal axes by means of a drive unit 9.

Furthermore, a toothed shaft 10 which extends along the transporting path of the carrier 6 and is mounted in fixed position is located in the lower region of the in-line vacuum coating chamber 1. This toothed shaft 10 is coupled to a rotary drive (not shown), with the toothed shaft 10 extending through the vacuum chamber 2. The length of the toothed shaft 10 corresponds to the length of the carrier 6, as will be explained hereinbelow.

Figure 2:
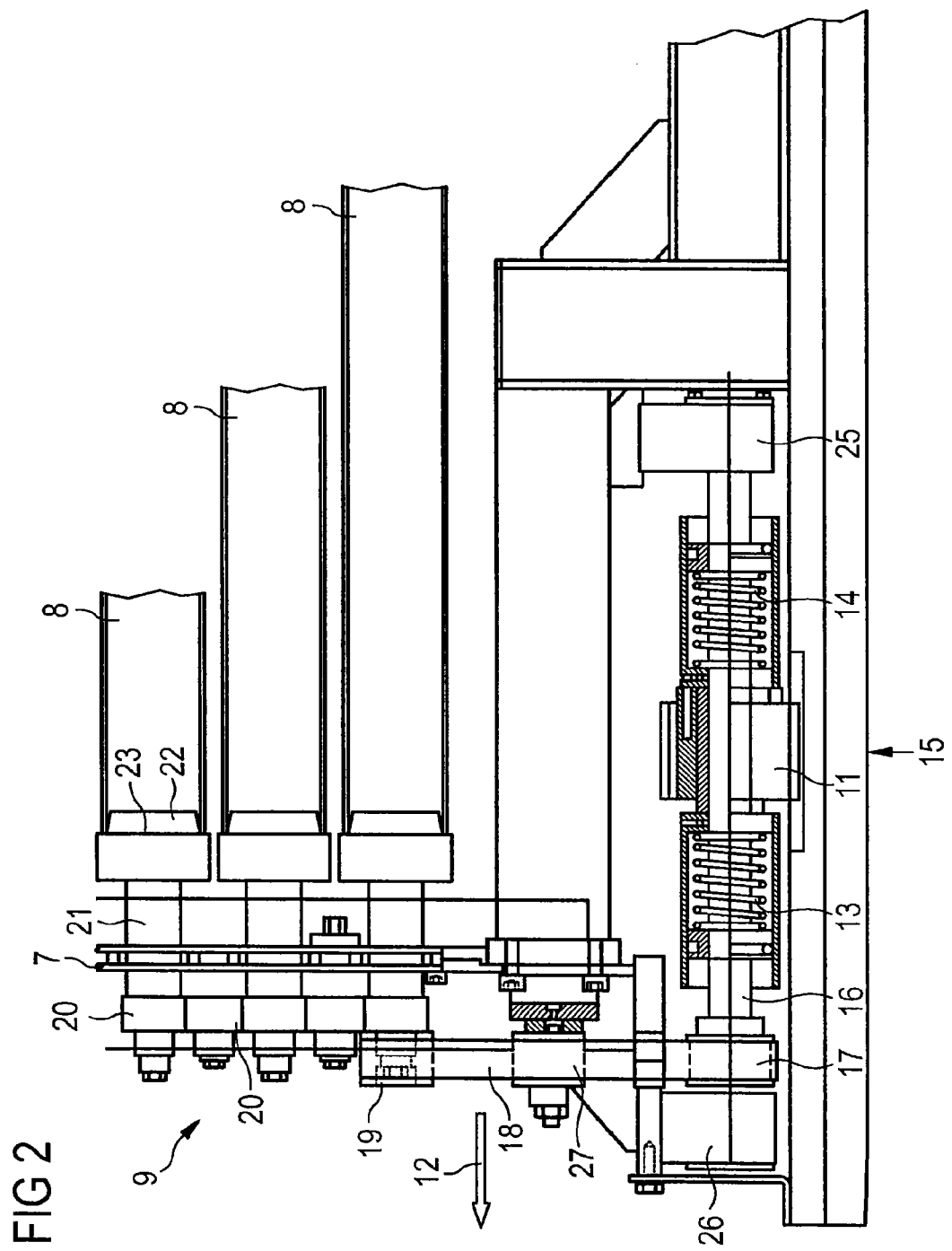
FIG. 2 shows an enlarged detail of the carrier with details of the drive.

FIG. 2 shows details of the drive unit 9 of the carrier 6. Located on the carrier 6 is a rotatably mounted gearwheel 11, which is held under spring loading between two compression springs 13, 14 in a starting position 15 on a shaft 16 which is mounted in a rotatable manner in bearing blocks 25, 26 on the carrier 6. This refinement of the invention is necessary especially when the carrier 6 is intended to travel counter to the direction of travel 12 through the in-line vacuum coating system 1, in order for example to achieve a greater coating thickness.

If it is intended to travel only in one direction of travel 12 through the in-line vacuum coating system 1, it is sufficient for the gearwheel 11 to be positioned under spring loading in a starting position 15 against a stop, wherein the stop, as seen in the direction of travel 12, is located downstream of the starting position 15, so that the gearwheel 11 can yield when it comes into contact with the toothed shaft 10.

The gearwheel 11 can be moved longitudinally in a positively locking manner on the rotatable shaft 16, as a result of which a rotational movement imparted to the gearwheel 11 is transferred to the shaft 16.

Located at one end of the shaft 16, in this case according to the drawing at the left-hand end, is a pulley 17 for holding a transmission belt 18. This transmission belt 18 runs on the drive-input side on the pulley 17 and on the drive-output side on a further pulley 19 which is coupled to further rollers 20. Located between the two pulleys 17, 19 is also a tension roller 27. The further pulley 19 is coupled to the further rollers 20 by way of frictional coupling or else by way of gearwheels, or an appropriate toothing.

The further pulley 19 and the further rollers 20 are mounted in a rotatable manner in the support frame 7 of the carrier 6.

In order to be able to grip tubular substrates 8 in a rotatable manner, the further rollers 20 are each provided in the axial direction over an axle stub 21 of a conical holder 22 for fixing the end side 23 of the tubular substrate 8, wherein the respectively other end side 23 of the tubular substrate 8 is mounted in a corresponding manner. It goes without saying that in order to securely hold the tubular substrates 8 the two conical holders 22 that are thus located opposite one another are braced against one another, for example under spring loading.

Figure 3:
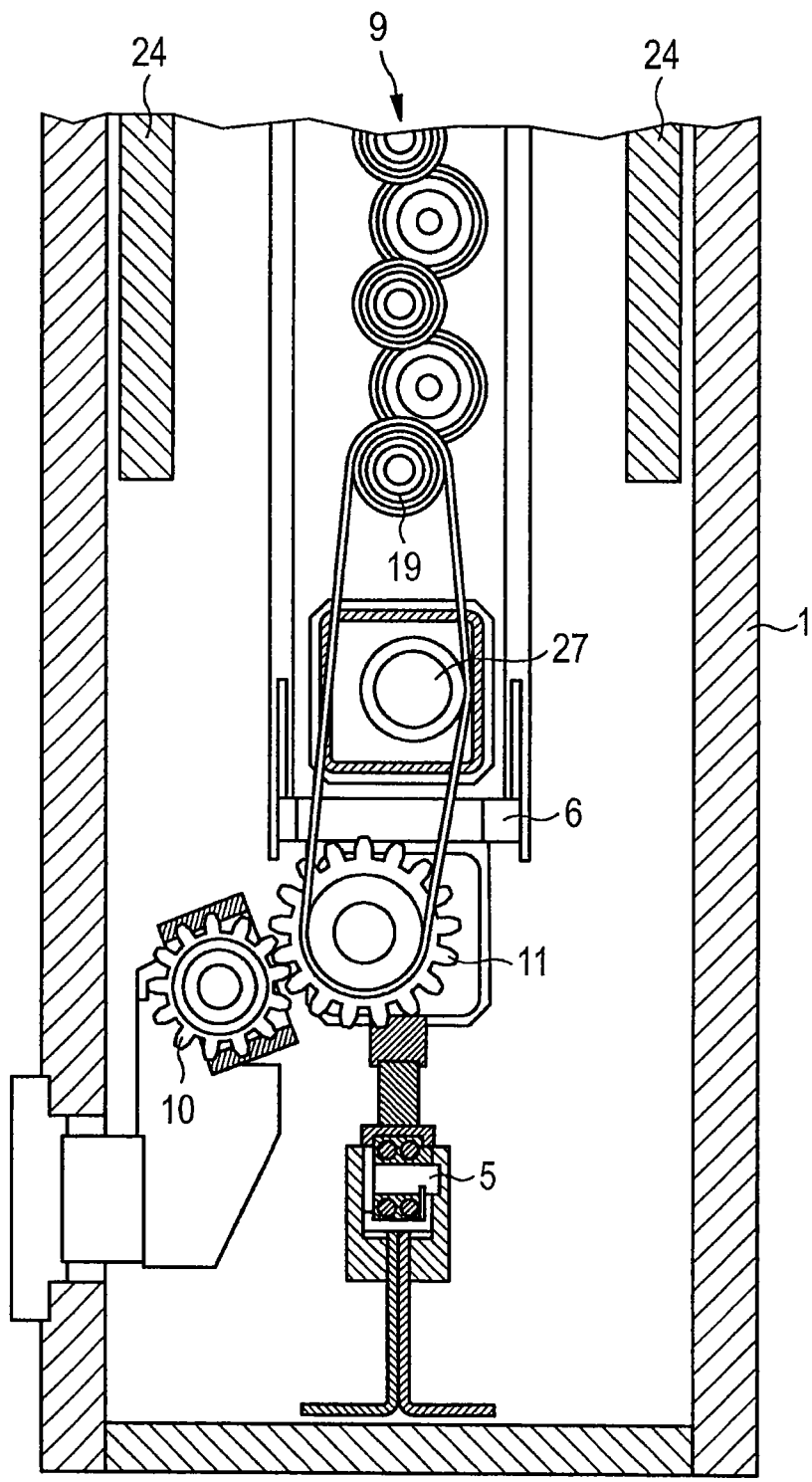
FIG. 3 shows a sectional illustration of the end view of the in-line vacuum coating system with the carrier located therein in an engagement position with a toothed shaft extending longitudinally through the vacuum chamber.

Furthermore, the toothed shaft 10, as main rotary drive, is mounted in a fixed position in the vacuum chamber 2, specifically in such a way in relation to the gearwheel 11 located on the carrier 6 that in the engagement position, as illustrated in FIG. 3, said gearwheel 11 meshes with the toothed shaft 10 over the longitudinal extent thereof.

If the carrier 6 is now moved in the direction of travel 12 toward the vacuum chamber 2 by means of the rotationally driven rollers 5, the gearwheel 11 on the carrier 6 comes into contact with the end side of the toothed shaft 10. Since the toothing on the gearwheel 11 can have any desired position with respect to the toothing on the toothed shaft 10 at the moment of contact, the toothing on the shaft 10 and on the gearwheel 11 very rarely mesh immediately. However, since the gearwheel 11 can be moved under spring loading out of the starting position 15, a relative movement takes place on account of the friction that occurs, until the toothings mesh, as can be seen in FIG. 3. Surprisingly, it has been shown that this is the case very quickly and after only a short relative movement.

While the carrier 6 continues to pass through the vacuum chamber, it is thus ensured that there is continuous contact between the toothed shaft 10 and the gearwheel 11. The toothed shaft 10, which is coupled to a rotary drive (not shown), thus ensures a continuous rotary drive of the pulley 15. Thus, a continuous rotational movement of the tubular substrates 8 takes place even while the carrier 6 is transported along the toothed shaft 10 through the vacuum coating chamber 2, as a result of which, in conjunction with the transport drive of the carrier 6 by means of the rollers 5, the tubular substrates are coated in a uniform helical, but gapless manner by means of the coating units 24 illustrated schematically in FIG. 3 as they travel through the vacuum coating chamber 2. As the coating unit 24, consideration is given, for example, to plasmatrons which are located on one or both sides of the carrier 6 in the vacuum coating chamber 2.

Instead of the coating units 24, which are illustrated schematically in FIG. 3 and are arranged to the right and the left of the transport path of the carrier 6 in the vacuum coating chamber 2, an arrangement with only one coating unit 24 is of course also possible.

It goes without saying that the toothed shaft 10 must be at least as long as the carrier 6 or the tubular substrates 8.

Alternatively, with the same function, the toothed shaft 10, in a similar manner to the gearwheel 11, can also be mounted under spring loading such that it can be moved longitudinally, with the gearwheel 11 in this case having to be securely fastened on the shaft 16.

The invention claimed is:

1. An in-line vacuum coating system having a vacuum coating chamber including at least one coating unit, and a carrier moveable through the vacuum coating chamber, for holding tubular substrates that can be rotated about their respective longitudinal axis, comprising a rotatable toothed shaft installed in a fixed position in the chamber and connectable to a rotary drive, and a gearwheel for engagement with the toothed shaft, the gearwheel being mounted in a rotatable manner on the carrier and to be moved longitudinally under spring loading by a predefined distance counter to direction of travel of the carrier, wherein the gearwheel is positioned in a starting position under spring loading between two compression springs.

2. The in-line vacuum coating system as claimed in claim 1, wherein the gearwheel has straight teeth.

3. The in-line vacuum coating system as claimed in claim 1, wherein the gearwheel is positioned under spring loading in the starting position against a stop which, as seen in the direction of travel is located downstream of the starting position.

4. The in-line vacuum coating system as claimed in claim 1, wherein the gearwheel is guided on a shaft secured in a fixed position to the carrier.

5. The in-line vacuum coating system as claimed in claim 1, wherein the gearwheel is moved longitudinally in a positively locking manner on a shaft which can be rotated in a fixed position in the carrier.

6. The in-line vacuum coating system as claimed in claim 5, wherein the shaft is provided at one end with a pulley for holding a transmission belt, which runs on a drive-input side on the pulley and on a drive-output side on a further pulley coupled to further rollers.

7. The in-line vacuum coating system as claimed in claim 6, wherein the further pulley is coupled to the further rollers by frictional coupling or gearwheels.

8. The in-line vacuum coating system as claimed in claim 6, wherein the further pulley and the further rollers are mounted in a rotatable manner in a support frame of the carrier.

9. The in-line vacuum coating system as claimed in claim 6, wherein the further rollers are each provided in an axial direction with a conical holder gripping a first end side of a tubular substrate, and wherein a respective other end side of the tubular substrate is gripped in a corresponding manner.

10. The in-line vacuum coating system as claimed in claim 1, wherein the toothed shaft is mounted in a fixed position in the vacuum coating chamber in such a way in relation to the gearwheel located on the carrier that in an engagement position said gearwheel meshes with the toothed shaft over a longitudinal extent of the toothed shaft.

* * * * *